United States Patent [19]

Taniguchi et al.

[11] Patent Number: 5,534,822
[45] Date of Patent: Jul. 9, 1996

[54] PARALLEL PHASE-LOCKED LOOP OSCILLATOR CIRCUITS WITH AVERAGE FREQUENCY CALCULATION OF INPUT STAGE LOOP

[75] Inventors: Atsuki Taniguchi; Chiyoko Yamamoto, both of Kawasaki, Japan

[73] Assignee: Fujitsu Limited, Kanagawa, Japan

[21] Appl. No.: 189,462

[22] Filed: Jan. 31, 1994

[30] Foreign Application Priority Data

Sep. 20, 1993 [JP] Japan .................................... 5-233101

[51] Int. Cl.⁶ .................................................. H03L 7/087
[52] U.S. Cl. .......................... 331/2; 331/1 A; 331/11; 375/376; 327/147; 327/151
[58] Field of Search ................................ 331/1 A, 2, 18, 331/11, 17; 375/376; 327/141, 147, 151

[56] References Cited

U.S. PATENT DOCUMENTS

| | | | |
|---|---|---|---|
| 3,626,426 | 12/1971 | Steinberg | 331/2 X |
| 4,066,978 | 1/1978 | Cox, Jr. et al. | 331/1 A |
| 4,438,412 | 3/1984 | Malinowski et al. | 331/2 |
| 4,500,851 | 2/1985 | Sawa et al. | 331/2 |
| 4,531,102 | 7/1985 | Whitlock et al. | 331/1 A |
| 4,633,193 | 12/1986 | Scordo | 331/1 A |
| 4,654,604 | 3/1987 | Smith et al. | 331/1 A |
| 4,896,337 | 1/1990 | Bushy, Jr. | 375/118 |
| 5,075,639 | 12/1991 | Taya | 331/2 |
| 5,144,254 | 9/1992 | Wilke | 328/14 |
| 5,194,828 | 3/1993 | Kato et al. | 331/1 A |
| 5,216,387 | 1/1993 | Telewski et al. | 331/11 |
| 5,319,680 | 6/1994 | Port et al. | 375/119 |

FOREIGN PATENT DOCUMENTS 2037512 7/1980 United Kingdom .............. 331/2

OTHER PUBLICATIONS

Takashi Inoue et al., "Interference Suppression Using DPLL with Notch Frequency Characteristic", Electronics and Communications in Japan, Part I, vol. 73, No. 4, Apr. 1990, pp. 48–55.

Primary Examiner—Robert Pascal
Assistant Examiner—Arnold Kinkead

[57] ABSTRACT

A phase-locked oscillator circuit with a broad pull-in frequency range generates a stable output signal synchronized to the phase of an input signal. An input-stage phase-locking circuit wherein the phase of a first frequency-converted output signal from a 1st frequency-conversion section is compared by a 1st phase-comparison circuit with the phase of the input signal and the phase of the 1st frequency-converted output signal is controlled. A processing section determines the frequency component of the input signal based on the phase-comparison output signal from the 1st phase-comparison circuit. An output-stage phase-locking circuit compares the phase of a 2nd frequency-conversion section with the phase of the input signal in a 2nd phase-comparison circuit. The phase of the 2nd frequency-conversion section is controlled based on the resulting phase-comparison output signal and the phase comparison output signal from the 1st phase-comparison circuit. Thus, the phase of the 2nd frequency-converted output signal is controlled.

9 Claims, 8 Drawing Sheets

PARALLEL PHASE-LOCKED LOOP OSCILLATOR CIRCUITS WITH AVERAGE FREQUENCY CALCULATION OF INPUT STAGE LOOP

BACKGROUND OF THE INVENTION

1. Field of the Invention

The present invention is related to a phase-locked oscillator circuit which provides a stable output signal synchronized to the phase of an input signal.

2. Description of the Related Art

In synchronous multiplexed transmission systems, a known method of network synchronization is that in which a highly stable clock signal is transmitted from the master station to a slave station, this clock signal being then transmitted from the slave station to other slave stations, each of the slave stations generating a clock signal which is phase-locked to the received clock signal, the generated clock signal being used to perform transmission processing.

Therefore, at each of the slave stations it is necessary to suppress the jitter of the clock signal received via the transmission path, and to generate a stabilized clock signal. For example, in a system which uses a ultra-precise network-synchronization equipment, because there is only a minute variation in phase, a configuration for generating a clock signal using a phase-locked oscillator circuit having a narrow loop bandwidth implemented by a microprocessor or other means is known. In contrast to this, in a configuration in which the master station has a clock generator which is of relatively high stability but not ultra-precise, wherein the clock signal from this clock generator is transmitted to the slave stations, each of the slave stations must have a phase-locked oscillator circuit having a wide pull-in frequency range. In addition, to achieve compactness in the slave stations, it is necessary to make the configuration used to generate such clock signals compact as well.

FIG. 8 shows an example of prior art, in which 81 is a phase-comparison circuit, 82 is a loop filter, 83 is a voltage-controlled oscillator (VCO), 84 is a frequency-conversion circuit, 85 is an M/M+1 frequency divider (hereinafter, referred to as a programmable-ratio frequency-division circuit), 86 is a frequency divider, and 87 is an AND circuit, and wherein frequency conversion is performed by frequency-conversion circuit 84 so that the oscillation frequency of voltage-controlled oscillator 83 is the same as the frequency of the input signal, and phase comparison is performed at phase-comparison circuit 81, the phase-comparison output signal passing through loop filter 82 to serve as the control voltage for voltage-controlled oscillator 83, so that an output signal locked to the phase of the input signal is obtained. By using the received clock signal as this input signal, it is possible to generate a phase-locked clock signal.

The frequency-conversion circuit 84 of this phase-locked oscillator circuit has M/M+1 frequency divider 85, the division ratio of which is switched between M and M+1, frequency divider 86 which controls the switching of this frequency divider, and AND circuit 87, and when the oscillation frequency of voltage-controlled oscillator 83 is not in integer relationship with the input signal frequency, the oscillation frequency of voltage-controlled oscillator 83 is converted so as to be the same as the input signal frequency. For example, if the oscillation frequency of voltage-controlled oscillator 83 is 51.84 MHz and the received signal frequency is 1.544 MHz, M=33, so that the M/M+1 frequency divider 85 divides frequency by 33 and 34, the result being 13 divisions by 34 with respect to 10 divisions by 33, so that the 51.84 MHz is frequency converted to 1.544 MHz.

To implement a phase-locked oscillator circuit having high frequency stability, it is necessary to make the loop bandwidth narrow, and also to make the loop gain small, in order to eliminate the influence of input signal variations occurring because of the transmission path and other factors. However, if the loop bandwidth is made narrow and the loop gain is made small, the frequency-tracking characteristics worsen, so that a large variation in input signal frequency causes loss of locking. That is, it becomes impossible to achieve a phase-locked oscillator circuit having a wide locking-on frequency range.

One approach to solving this problem is that of maintaining a narrow loop bandwidth and making the loop gain large. However, doing this results in a worsening of the damping factor, which results in a decrease in the stability of the output signal frequency. If, on the other hand, the loop bandwidth is broadened, although the locking-on frequency range is broadened, tracking of even minute variations in input signal frequency occurs, making it impossible to achieve a phase-locked oscillator circuit with high stability. That is, the phase-locked oscillator circuit exhibits mutually exclusive characteristics, making it impossible with previous examples of phase-locked oscillator circuits to achieve both a broad locking-on frequency range and high stability.

For example, in a synchronous multiplexed transmission system such as mentioned previously, it is desirable to have a phase-locked oscillator circuit that not only has performance such as a locking-on frequency range of ±20 ppm, short-term stability of $5 \times 10^{-9}$ seconds per second, jitter immunity of 1.5 UI (unit intervals), and frequency of 10 to 150 Hz, but is compact as well.

SUMMARY OF THE INVENTION

The purpose of the present invention is to provide a phase-locked oscillator circuit having characteristics which satisfy requirements such as described above.

Using FIG. 1 to describe the present invention, the phase-locked oscillator circuit of the present invention has input-stage phase-locking circuit 2 which uses the 1st phase-comparison circuit 1 to compare the phase of the 1st frequency-converted output, which is derived by frequency division, with the phase of the input signal, and which has a feedback loop that controls the phase of the 1st frequency-converted output signal, processing section 3 that determines the frequency component of the input signal based on the phase-comparison output signal of the 1st phase-comparison circuit 1, and output-stage phase-locking circuit 5, which uses 2nd phase-comparison circuit 4 to compare the phase of the 2nd frequency-converted output, which is derived by frequency division, with the phase of the input signal, and which has a feedback loop that controls the phase of the 2nd frequency-converted output signal based on the phase-comparison output signal of the 2nd phase-comparison circuit 4 and processed output signal from processing section 3.

It is possible to make the time constant of the input-stage phase-locking circuit 2 short while making the time constant of the output-stage phase-locking circuit 5 long.

The input-stage phase-locking circuit 2 can be configured to comprise a 1st phase-comparison circuit 1, a programmable-ratio frequency-division circuit for example, the M/M+1 frequency divider, which generates the 1st frequency-converted output signal, and a 1st lead/lag control section which performs switching control of the frequency-division ratio of the 1st programmable-ratio frequency-division circuit, based on the phase-comparison output signal from the 1st phase-comparison circuit 1.

The processing section 3 can be configured to include an average-frequency calculating section which determines the average frequency of the input signal, based on the phase-comparison output signal from the 1st phase-comparison circuit 1 of input-stage phase-locking circuit 2.

The output-stage phase-locking circuit 5 can be configured to comprise a 2nd phase-comparison circuit 4, a 2nd programmable-ratio frequency-division circuit, such as the M/M+1 frequency divider, which generates the 2nd frequency-converted output signal, and a 2nd lead/lag control section which performs switching control of the frequency-division ratio the 2nd programmable-ratio frequency-division circuit, based on the phase-comparison output signal from the 2nd phase-comparison circuit 4, and on the processed output signal from processing section 3.

The 1st phase-comparison circuit 1 of input-stage phase-locking circuit 2 can be configured to detect whether the phase of the 1st frequency-converted output signal leads or lags with respect to the input signal.

Processing section 3 can be configured to have a counter which counts either the lead or the lag phase-comparison output signal of the 1st phase-comparison circuit 1 of input-stage phase-locking circuit 2, and an average-value calculating section which determines the time average of the count of this counter.

The 2nd phase-comparison circuit 4 of output-stage phase-locking circuit 5 can be configured to detect whether the phase of the 2nd frequency-converted output signal leads or lags with respect to the input signal.

A configuration can be made wherein the 1st frequency-converted output signal of input-stage phase-locking circuit 2 and the 2nd frequency-converted output signal of output-stage phase-locking circuit 5 can be derived by using the 1st and 2nd programmable-ratio frequency-division circuits, respectively, to frequency divide the output signals from a fixed-frequency oscillator.

A configuration can be made wherein the processed output signal applied to the output-stage phase-locking circuit 5 from processing section 3 is fixed by means of a holdover signal.

The input-stage phase-locking circuit 2 compares the phase of the 1st frequency-converted output signal from frequency-conversion section 6 with the phase of the input signal using the 1st phase-comparison circuit 1, the phase-comparison output signal of this phase-comparison circuit controlling frequency-conversion section 6, and the phase of the 1st frequency-converted output signal being locked to the phase of the input signal. Processing section 3 determines the frequency component of the input signal, based on the phase-comparison output of the 1st phase-comparison circuit 1. The output-stage phase-locking circuit 5 compares the phase of the input signal with the phase of the 2nd frequency-converted output signal from the frequency-conversion section 7. Processing section 3 controls the frequency-conversion section 7 based on the frequency component of the input signal, and also controls the phase of the frequency-converted output signal, based on the phase-comparison output signal from 2nd phase-comparison circuit 4. Thus, the input-stage phase-locking circuit 2 performs synchronization to the frequency of the input signal, and the output-stage phase-locking circuit 5 performs synchronization to the phase of the input signal.

The time constant of input-stage phase-locking circuit 2 is set to be short, so that the 1st frequency-converted output signal is controlled to track the frequency of the input signal, and the time constant of output-stage phase-locking circuit 5 is set to be long, so that the phase of the 2nd frequency-converted output signal is synchronized to the phase of the input signal. Thus, with its narrow loop bandwidth, input-stage phase-locking circuit 2 improves the frequency stability, with the response to frequency variations being improved by the wide loop bandwidth of output-stage phase-locking circuit 5.

The input-stage phase-locking circuit 2 comprises the 1st phase-comparison circuit 1 and frequency-conversion section 6 which comprises a programmable-ratio frequency-division circuit and 1st lead/lag control section, with this 1st lead/lag control section performing control of the division ratio of the programmable-ratio frequency-division, according to the phase-comparison output signal from the 1st phase-comparison circuit 1. This enables the frequency of the 1st frequency-converted output signal to be tracked to the frequency of the input signal.

The average-frequency calculating section of processing section 3 determines the average value of the phase-comparison output signal of the 1st phase-comparison circuit 1 of input-stage phase-locking circuit 2, enabling determination of the average frequency of the input signal.

The output-stage phase-locking circuit 5 comprises the 2nd phase-comparison circuit 4, the frequency-conversion section 7 which comprises the 2nd programmable-ratio frequency-division circuit, and the 2nd lead/lag control section, this 2nd lead/lag control section performing switching control of the division ratio of the 2nd programmable-ratio frequency-division circuit, based on the phase-comparison output signal from the 2nd phase-comparison circuit 4 and on the processed output signal from processing section 3, thus locking the phase of the 2nd frequency-converted output signal to the phase of the input signal, this signal being taken as the output signal locked to the phase of the input signal.

The 1st phase-comparison circuit 1 of input-stage phase-locking circuit 2 compares the phase of the input signal to the phase of the 1st frequency-converted output signal, which is derived from frequency-conversion section 6, and detects whether the phase is leading or lagging.

Since the phase-comparison output signal from the 1st phase-comparison circuit 1 indicates either a leading phase or a lagging phase, processing section 3 counts up a phase-leading phase-comparison output signal over a given period of time with a counter, or counts up a phase-lagging phase-comparison output signal over a given period of time with a counter. The averaging-value calculating section determines the average count of the counter occurring over a given period of time. This average value corresponds to the average frequency of the input signal.

The 2nd phase-comparison circuit 4 of output-stage phase-locking circuit 5 also compares the phase of the input signal with the phase of the 2nd frequency-converted output signal, which is derived from the frequency-conversion section 7, and detects whether the phase is leading or lagging.

The output signal of the fixed-frequency oscillator 8 can be applied via the dotted-line arrows to frequency-conversion sections 6 and 7 of input-stage phase-locking circuit 2 and output-stage phase-locking circuit 5, enabling use as the 1st and 2nd frequency-converted output signals.

When the input signal is cut off or otherwise lost, the holdover signal serves to hold fixed the processed output signal applied to output-stage phase-locking circuit 5 from processing section 3, to obtain an output signal from output-stage phase-locking circuit 5 having the immediately previous frequency and phase.

DETAILED DESCRIPTION OF THE PREFERRED EMBODIMENTS

Figure 2:
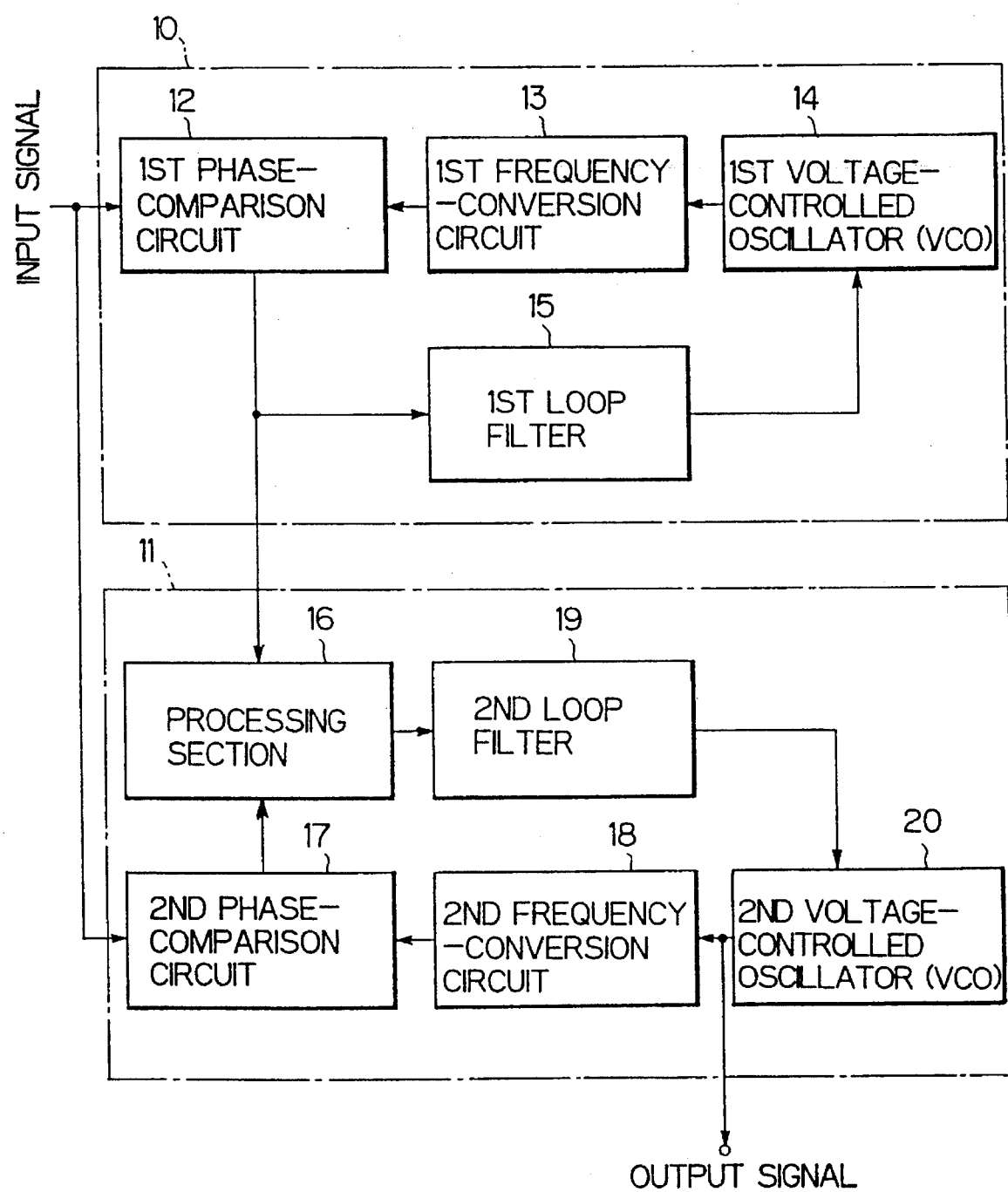
FIG. 2 shows the 1st embodiment of the present invention.

FIG. 2 shows the 1st embodiment of the present invention, which has input-stage phase-locking circuit 10 and output-stage phase-locking circuit 11, and wherein processing section 16 is provided within output-stage phase-locking circuit 11. In this embodiment, 12 is the 1st phase-comparison circuit, 13 is the 1st frequency-conversion circuit, 14 is the 1st voltage-controlled oscillator (VCO), 15 is the 1st loop filter, 17 is the 2nd phase-comparison circuit, 18 is the 2nd frequency-conversion circuit, 19 is the 2nd loop filter, and 20 is the 2nd voltage-controlled oscillator (VCO).

This is an embodiment wherein voltage-controlled oscillators 14 and 20 are provided in input-stage phase-locking circuit 10 and in output-stage phase-locking circuit 11, respectively, with control voltages applied through loop filters 15 and 19 to control the phase of the output signals from voltage-controlled oscillators 14 and 20, and wherein input-stage phase-locking circuit 10 frequency converts the output signal of 1st voltage-controlled oscillator 14 by means of 1st frequency-conversion circuit 13, so that its frequency is the same as the frequency of the input signal, the phase being compared by means of 1st phase-comparison circuit 12, the resulting phase-comparison output signal being passed through 1st loop filter 15 and used as the control voltage for 1st voltage-controlled oscillator 14.

Output-stage phase-locking circuit 11 frequency converts the output signal from 2nd voltage-controlled oscillator 20 by means of 2nd frequency-conversion circuit 18, so that its frequency is the same as the frequency of the input signal, with phase comparison performed by 2nd phase-comparison circuit 17, the resulting phase-comparison output signal being applied to processing section 16. The phase-comparison output signal from 1st phase-comparison circuit 12 of input-stage phase-locking circuit 10 is also applied to this processing section 16, from which the frequency component is determined, with the phase-comparison output signal from 2nd phase-comparison circuit 17 being used as the phase component, this being passed through 2nd loop filter 19 and applied to 2nd voltage-controlled oscillator 20 as the control voltage.

The loop bandwidth of input-stage phase-locking circuit 10 is made wide, the loop gain of input-stage phase-locking circuit 10 is made large, the loop bandwidth of output-stage phase-locking circuit 11 is made narrow, and the loop gain of output-stage phase-locking circuit 11 is made small, with input-stage phase-locking circuit 10 capable of tracking the frequency variations of the input signal. By using also the control data of input-stage phase-locking circuit 10, output-stage phase-locking circuit 11 tracks the input signal, while providing suppression of jitter and a stable output signal. Therefore, it is possible for a slave station to receive the clock signal from a master station, phase-lock to the received clock signal, and to also generate a stabilized clock signal.

Although this embodiment is one in which input-stage phase-locking circuit 10 and output-stage phase-locking circuit 11 have 1st voltage-controlled oscillator 14 and 2nd voltage-controlled oscillator 20, respectively, it is also possible to make a configuration wherein a common fixed-frequency oscillator used, with phase control performed by, for example, switching the division ratio of frequency-conversion circuits 13 and 18.

Figure 3:
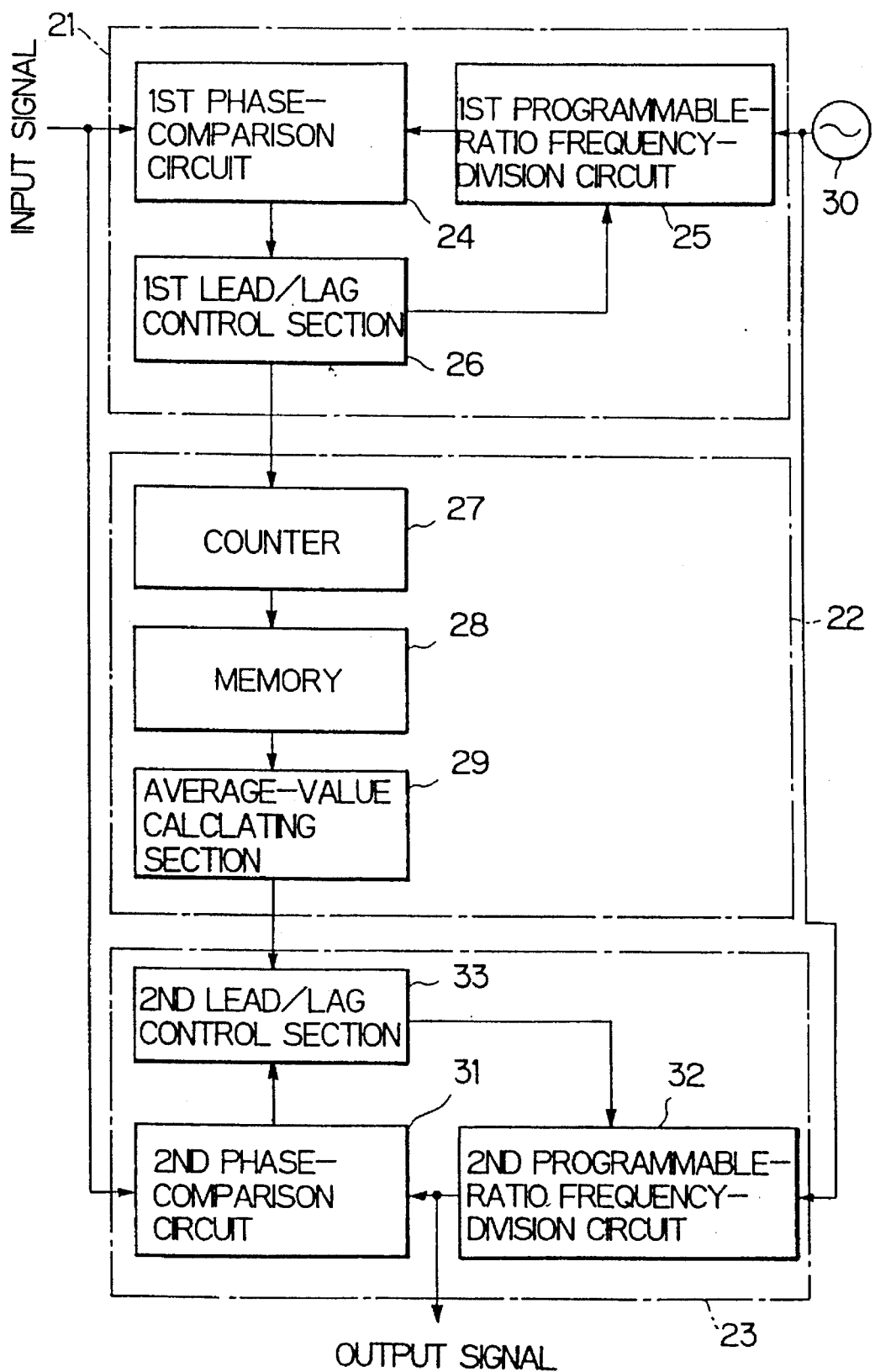
FIG. 3 shows the 2nd embodiment of the present invention.

FIG. 3 shows the 2nd embodiment of the present invention, in which 21 is input-stage phase-locking circuit, 22 is the processing section, 23 is the output-stage phase-locking circuit, 24 is the 1st phase-comparison circuit, 25 is the 1st programmable-ratio frequency-division circuit, 26 is the 1st lead/lag control section, 27 is a counter, 28 is a memory, 29 is the average-value calculating section, 30 is the fixed-frequency oscillator, 31 is the 2nd phase-comparison circuit, 32 is the 2nd programmable-ratio frequency-division circuit, and 33 is 2nd lead/lag control section. Whereas in the previously described 1st embodiment shown in FIG. 1 the configuration had an analog control loop, this embodiment is that of a fully digital circuit configuration.

Figure 1:
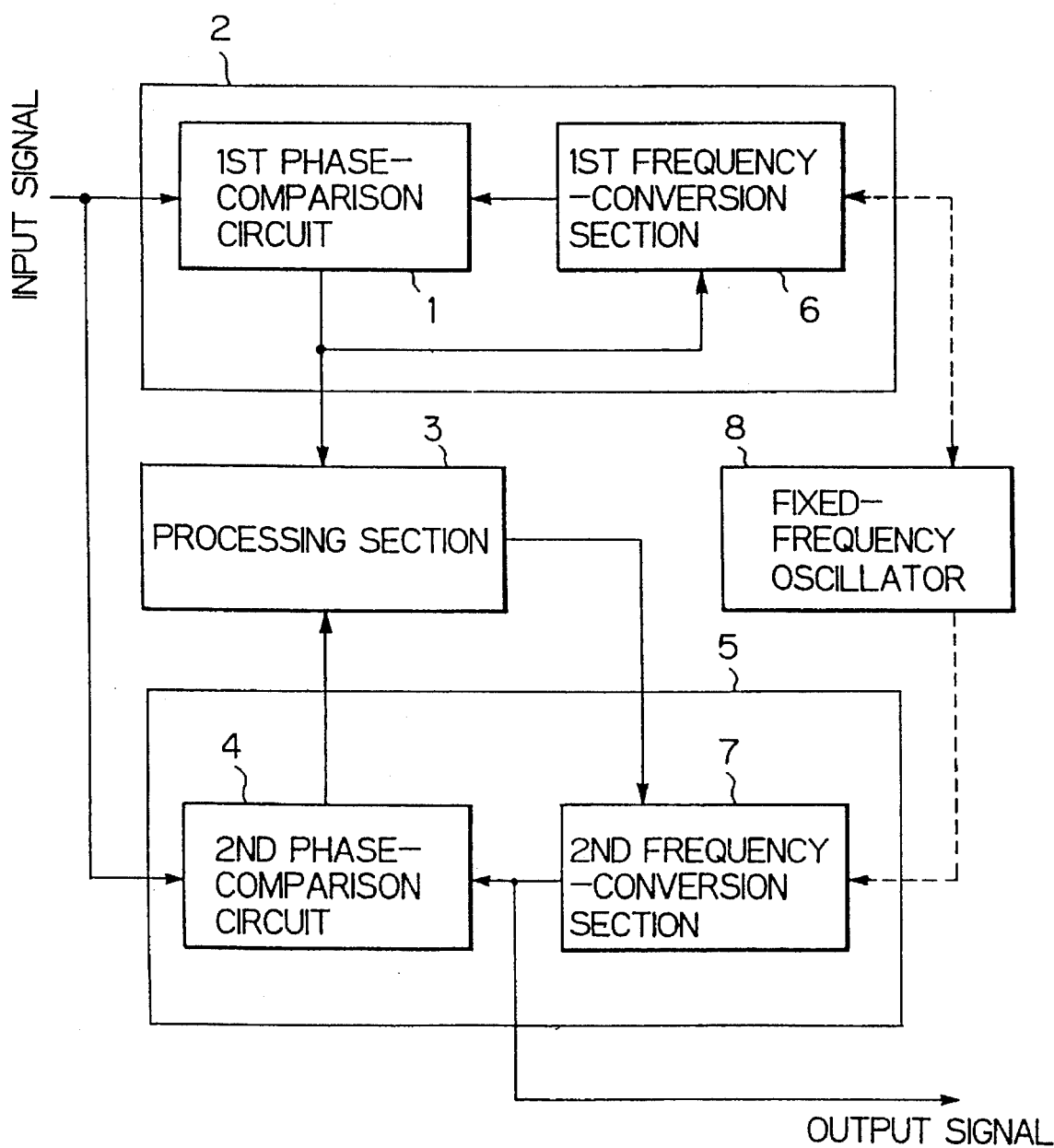
FIG. 1 shows the principle of the present invention.

If, for example, the input signal frequency is 1.544 MHz, the oscillation frequency of fixed-frequency oscillator 30 is 51.84 MHz, and the output frequency is 1.544 MHz, the configuration would be such that the programmable-ratio frequency-division circuits 25 and 32, which correspond to the frequency-conversion sections 6 and 7 of FIG. 1, would be switched between division by 33 and division by 34. Dividing the oscillation output signal of fixed-frequency oscillator 30 by 33 results in 1.571 MHz, whereas dividing it by 34 results in 1.525 MHz. Therefore, by taking 10 times the division by 33 and 13 times the division by 34, it is possible to convert 51.84 MHz to 1.544 MHz. It is possible to control the switching of the division ratio of the programmable-ratio frequency-division circuits to enable tracking over a range of ±1% or greater with respect to 1.544 MHz.

The 1st and 2nd phase-comparison circuits 24 and 31 compare the phase of the 1st and 2nd frequency-converted output signals, which are derived from the 1st and 2nd programmable-ratio frequency-division circuits 25 and 32, with the phase of the input signal, and output phase-comparison signals which indicate whether the phase is leading or lagging. Therefore, relatively simple implementation is possible using, for example, flip-flops.

If the phase-comparison output signal from 1st phase-comparison circuit 24 indicates that the phase of the 1st frequency-converted output signal is leading with respect to the input signal, the 1st lead/lag control section 26 controls the 1st programmable-ratio frequency-division circuit 25 so that its division ratio is switched to 34, resulting in a 1st frequency-converted output signal frequency of 1.525 MHz. In other words, the signal is controlled in the lag direction.

If, on the other hand, the phase-comparison output signal from 1st phase-comparison circuit 24 indicates that the 1st frequency-converted output signal is lagging with respect to the input signal, the 1st programmable-ratio frequency-division circuit 25 is controlled so that its division ratio is switched 33, resulting in a 1st frequency-converted output signal frequency of 1.571 MHz. In other words, the signal is controlled in the lead direction.

Counter 27 of the processing section 22 counts the number of times the 1st lead/lag control section 26 performs lead control over, for example, a 0.5-second period, this count being written into memory 28. When 32 writes are done into memory 28, average-value calculating section 29 adds the count values for the 32 times and divides this, for example by 16, to determine the average value over a period of 1 second. Thus, it is possible to use counter 27 with a relatively small counting capacity to determine the average value of number of of lead controls over a relatively long period of time.

In dividing the 51.84-MHz signal from fixed-frequency oscillator 30 using the 1st programmable-ratio frequency-division circuit 25, if division by 33 (lead control) is performed 10 times and division by 34 (lag control) is performed 13 times, the resulting frequency of the frequency-converted output signal is 1.544 MHz. That is, it is known that the input signal frequency is 1.544 MHz if the average number of times lead control is performed is 10/23, so that if the input signal frequency differs from this, the average value will also differ from 10/23. It is also possible to count and take the average value of the number of times lag control is performed, instead of the number of time lead control is performed.

The 2nd phase-comparison circuit 31 of output-stage phase-locking circuit 23 compares the phase of the 2nd frequency-converted output signal from 2nd programmable-ratio frequency-division circuit 32 with the phase of the input signal. The phase-comparison output signal which indicates whether the phase of the 2nd frequency-converted output signal leads or lags with respect to the input signal is applied to the 2nd lead/lag control section 33. This lead/lag control section 33 performs switching control of the division ratio of 2nd programmable-ratio frequency-division circuit 32, according to the average value of the number of times lead control is performed as determined by average-value calculating section 29 of processing section 22, and also performs switching control of the division ratio according to the phase-comparison output signal from 2nd phase-comparison circuit 31.

Therefore, because the division ratio of 2nd programmable-ratio frequency-division circuit 32 of output-stage phase-locking circuit 23 is switching controlled according to the average frequency of the input signal, and according to the phase difference between the 2nd frequency-converted output signal and the input signal, it is possible not only to track the input signal frequency, but to generate a stable output signal locked to the phase of the input signal. By using a digital circuit which enables the elimination of the loop filter, semiconductor IC implementation is facilitated.

Figure 4:
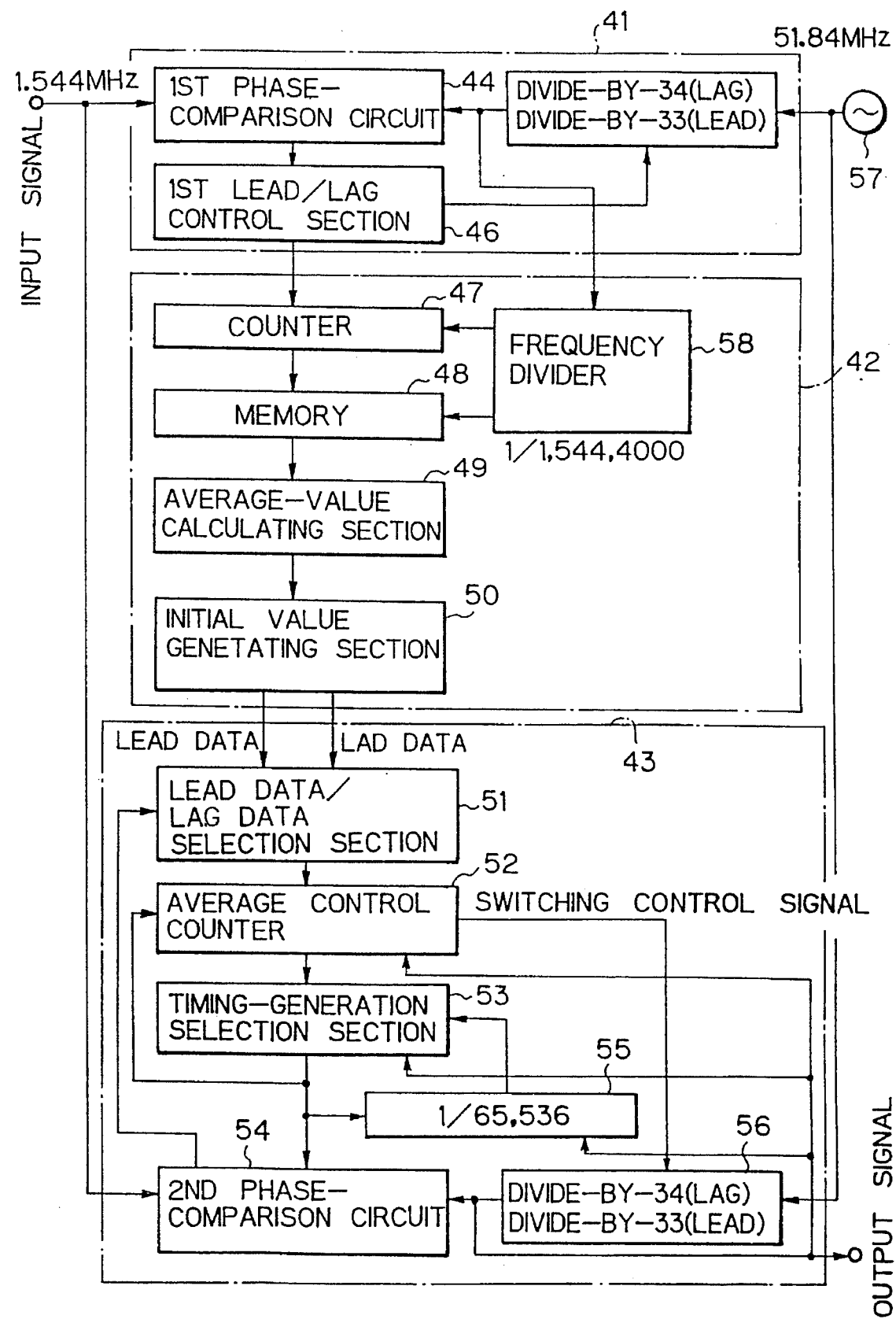
FIG. 4 shows the 3rd embodiment of the present invention.

FIG. 4 shows the 3rd embodiment of the present invention, in which 41 is the input-stage phase-locking circuit, 42 is the processing section, 43 is the output-stage phase-locking circuit, 44 is the 1st phase-comparison circuit, 45 is the 1st programmable-ratio frequency-division circuit, 46 is the 1st lead/lag control section, 47 is a counter, 48 is a memory, 49 is the average-value calculating section, 50 is the initial-value generating section, 51 is the lead data/lag data selection section, 52 is the average control counter, 53 is the timing-generation section, 54 is the 2nd phase-comparison circuit, 55 is a frequency divider, 56 is the 2nd programmable-ratio frequency-division circuit, 57 is a fixed-frequency oscillator, and 58 is a frequency divider.

Input-stage phase-locking circuit 41 has the same type of configuration as input-stage phase-locking circuit 21 of FIG. 3. That is, the 51.84-MHz signal from fixed-frequency oscillator 57 is frequency divided by 1st programmable-ratio frequency-division circuit 45 to serve as the 1st frequency-converted output signal, the phase of this 1st frequency-converted output signal being compared with the phase of the 1.544-MHz input signal by the 1st phase-comparison circuit 44. By applying to the 1st lead/lag control section 46 a phase-comparison output signal which indicates whether the phase of the 1st frequency-converted output signal leads or lags with respect to the input signal, switching control of the division ratio of 1st programmable-ratio frequency-division circuit 45 is performed from this 1st lead/lag control section 46.

The number of times lead control of 1st programmable-ratio frequency-division circuit 45 is performed by 1st lead/lag control section 46 is counted by counter 47 of processing section 42. Also, frequency divider 58 divides the 1st frequency-converted output signal by 1,544,000, so that a 1-Hz signal is applied to counter 47 and to memory 48, with the number of lead control operations which is counted by counter 47 being written into memory 48 every 1 second.

The average-value calculating section 49 adds the values written into memory 48, and divides it, for example dividing the total for 16 times by 16 to enable determination of the average number of times lead control is performed over a period of 1 second. The value determined by average-value calculating section 49 is applied to the initial-value generating section 50, and used as the initial value for lead data and lag data set into the average control counter 52 of output-stage phase-locking circuit 43.

The lead data/lag data selection section 51 of output-stage phase-locking circuit 43 selects either lead data or lag data, depending upon the selection signal from the 2nd phase-comparison circuit 54, and applies this to the average control counter 52. This average control counter 52 has a configuration consisting of, for example, a 26-stage counter, into which the lead data or lag data selected by lead data/lag data selection section 51 is loaded in accordance with the timing signal from timing-generation section 53, the output signal being counted up, this counter performing switching control of the division ratio 2nd programmable-ratio frequency-division circuit 56 and control of timing-generation section 53.

Frequency divider 55 is reset by the phase-comparison timing signal from timing-generation section 53, divides the 1.544-MHz output signal by 65,536, and notifies timing-generation section 53 that the specified time has arrived. The 2nd phase-comparison circuit 54 compares the phase of the frequency-converted output signal from 2nd programmable-ratio frequency-division circuit 56 with the phase of the input signal at a timing established by the phase-comparison timing signal from timing-generation section 53, and applies the phase-comparison output signal which indicates whether the phase is leading or lagging as the selection signal to lead data/lag data selection section 51.

Figure 5:
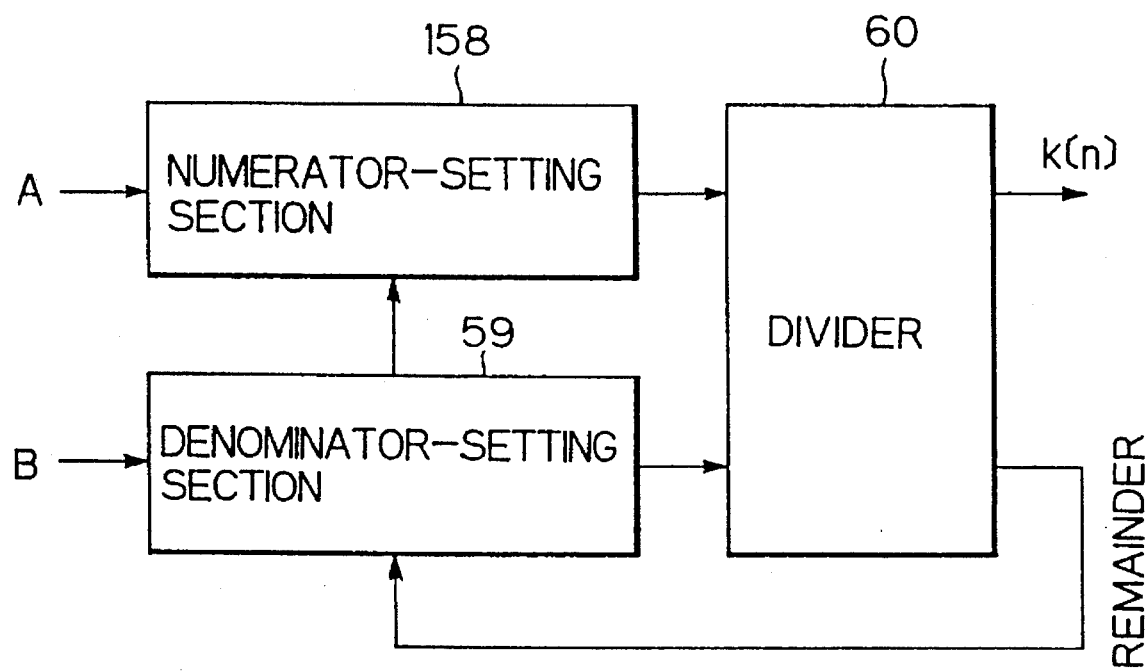
FIG. 5 shows the main parts of the initial-value generating section.

FIG. 5 shows the main parts of the initial-value generating section, in which 158 is the numerator-setting section, 59 is the denominator-setting section, and 60 is a divider, this section serving to generate the lead data for initial-value generating section 50 of processing section 42. In the initialized state, the overall number of times A is set into numerator-setting section 158, and the number of control times B is set into denominator-setting section 59. This number of control times B indicates the number of control operations determined by average-value calculating section 49, while the overall number of times A corresponds to the sum of the lead control operations and the lag control operations.

At first, the quotient A/B of divider 60 is the initial value k[0], the remainder C is set into the denominator-setting section 59, and this value B set into the denominator-setting section 59 is set into the numerator-setting section 158. Therefore, divider 60 performs the division B/C, with the quotient taken as the initial value k[1], and the remainder D set into denominator-setting section 59, the value of C which had been set into the denominator-setting section 59 being set into the numerator-setting section 158. Then divider 60 performs the division C/D, the quotient taken as the initial value k[2], the remainder E being set into denominator-setting section 59 as the initial value of k[2], and the value of D which had been set into denominator-setting section 59 being set into numerator-setting section 158. Thereafter, it is possible in a similar manner to generate the required number of initial values k[n]. Should the remainder be zero, subsequent divisions are terminated.

Figure 6:
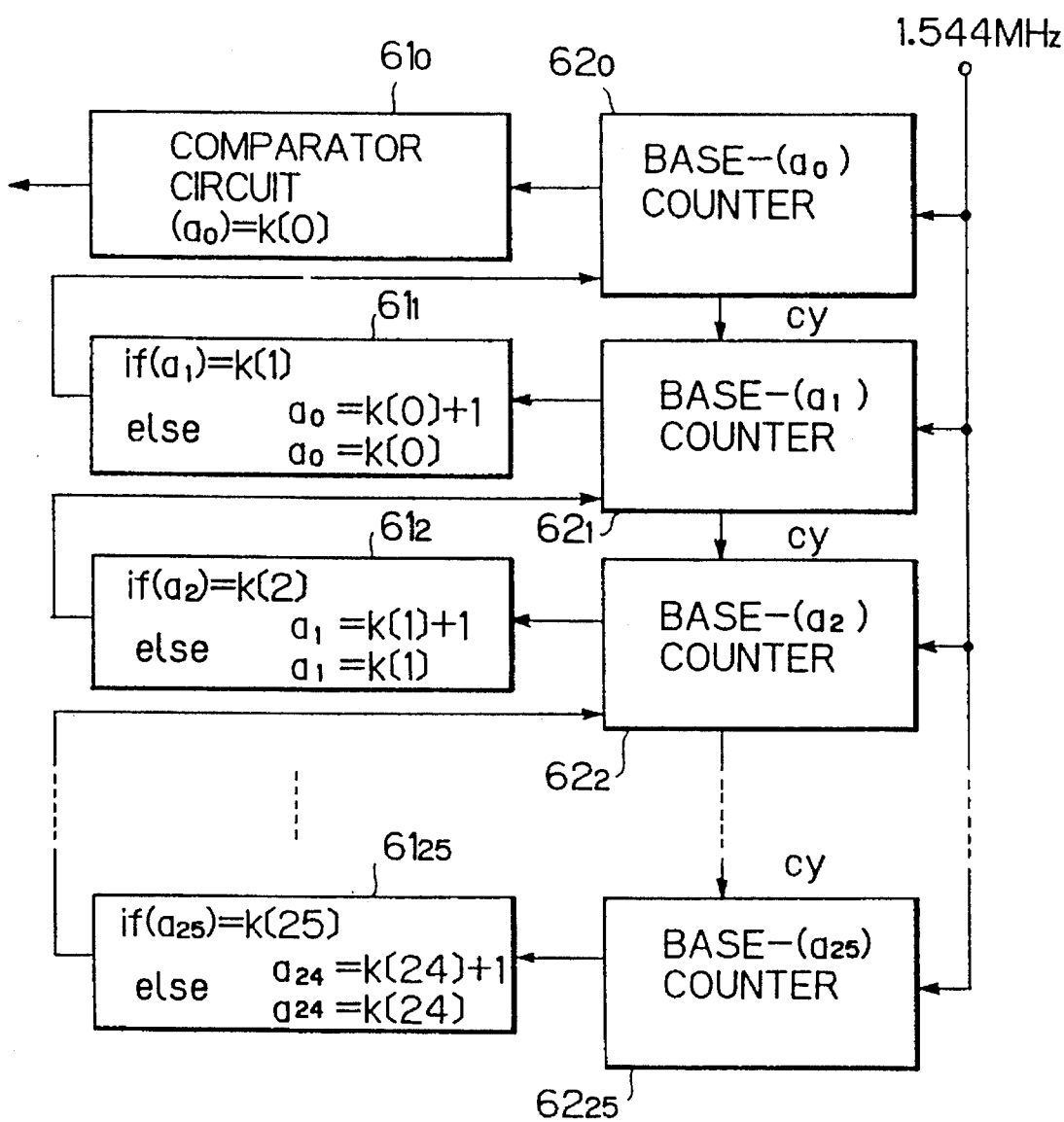
FIG. 6 shows the main parts of the average control counter.

FIG. 6 shows the main parts of the average control counter for a 26-stage configuration, in which $61_0$ to $61_{25}$ are comparator circuits, and $62_0$ to $62_{25}$ are base-$(a_0)$ to base-$(a_{25})$ counters. For the base-$(a_0)$ to base-$(a_{25})$ counters, the bases are selected so that the relationship $(a_0)<(a_1)<(a_2)<...<(a_{25})$ is satisfied. The configuration is made so that the 1.544-MHz output signal is counted, the resulting carry cy being output at a counter having a large division ratio, and further so that if a counter with a small division ratio does not output the carry cy, counters with large division ratios will not output the carry cy.

The comparator circuits $61_{10}$ to $61_{25}$ compare the initial values k[0] to k[25] with the count at respective counters $62_0$ to $62_{25}$, and if at the comparator circuit $61_0$ the initial value k[0] is the same as the count value $a_0$, a switching control signal is output to 2nd programmable-ratio frequency-division circuit 56. If a comparison at comparator $61_1$ indicates that the initial value k[1] is the same as the count at counter $62_1$, control is performed such that the base-$(a_0)$ counter $62_0$ operates as a base-(k[0]+1) counter, with the other counters operating as base-(k[0]) counters.

This process continues thereafter in the same manner, and if comparator $61_{25}$ compares the initial value k[25] with the count at counter $62_{25}$ and the values are the same, control is performed such that the base-$(a_{24})$ counter operates as a base-(k[24]+1) counter, with other counters operating as base-k[24]) counters. The configuration is such that if the initial value of k[j] (where j=0 to 25) is zero, subsequent counters and comparator circuits do not perform the above-described control operations. Therefore, it is possible to output a division ratio switching control signal for 2nd programmable-ratio frequency-division circuit 56 in accordance with the initial values k[j] generated in the initial value generating section 50.

Timing-generation section 53 has input to it the carry cy from counters $62_0$ to $62_{25}$ of the average control counter 52, and outputs a timing signal as a phase-comparison timing signal to the 2nd phase-comparison circuit 54, as a reset signal to frequency divider 55, and as a reset and load signal to average control counter 52.

This timing signal must be generated during a time when the phase comparison is being performed stably. To achieve this, it is possible, for example, to generate the timing signal based on the carry cy of a given stage α of the counters $62_0$ to $62_{25}$ of the average control counter 52. If a long time is required before this stage α counter outputs the carry cy, since a comparison is not performed during this period of time, it is possible to identify when the given time of, for example, frequency divider 55 has occurred from the output signal (1.544 MHz) count, and to notify timing-generation section 53 of this, so that the timing signal is caused to be output. The relationship between the signal for the required time and the above-described carry cy can be determined from the various condition settings, for the purpose of generating the timing signal.

The 2nd phase-comparison circuit 54 compares the phase of the 2nd frequency-converted output signal to that of the input signal, in accordance with the timing signal from timing-generation section 53, and controls the lead data/lag data selection section 51 in accordance with the phase-comparison output signal which indicates either a leading or a lagging phase, with either lead data or lag data applied to average control counter 52.

Therefore, the division ratio of 2nd programmable-ratio frequency-division circuit 56 is switched to be either division by 33 and division by 34, not only in accordance with the average frequency of the input signal, but also in according to the results of the phase comparison of the 2nd frequency-converted output signal with the input signal as performed by 2nd phase-comparison circuit 54. As a result, if there is no variation in the frequency of the input signal, the output signal will be stabilized in synchronization with the phase of this input signal, and if there is a variation in the frequency of the input signal, the frequency of the output signal will track this variation, after which the output signal stabilizes.

This configuration not only does not require a loop filter in the feedback loop used to achieve phase locking, but also can be totally implemented implemented using digital circuits, facilitating implementation using semiconductor integrated circuits. This not only makes possible a compact implementation, but also enables generation of a stable clock signal locked to the phase of a clock signal received from the master station.

Figure 7:
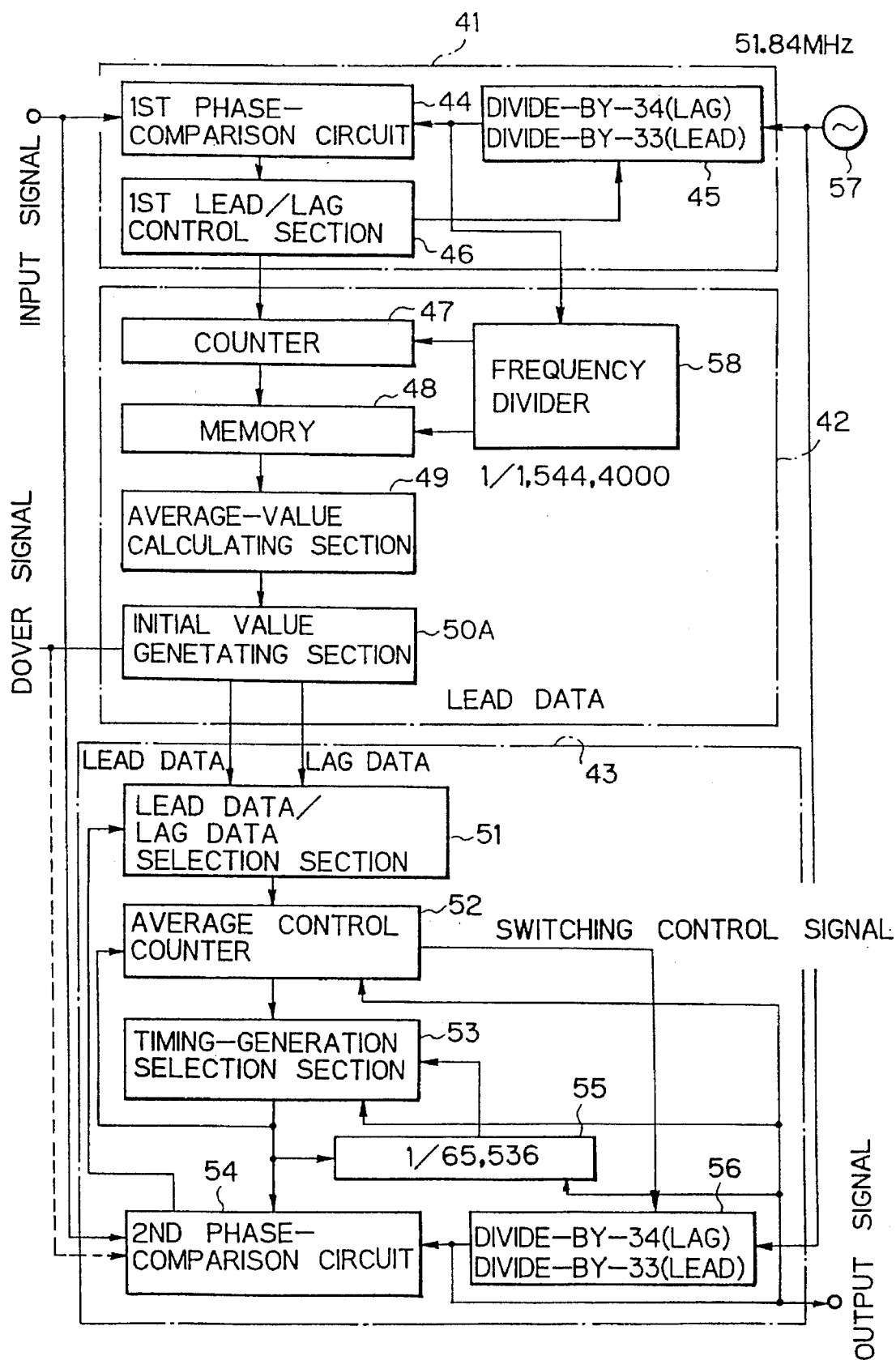
FIG. 7 shows the 4th embodiment of the present invention.
Figure 8:
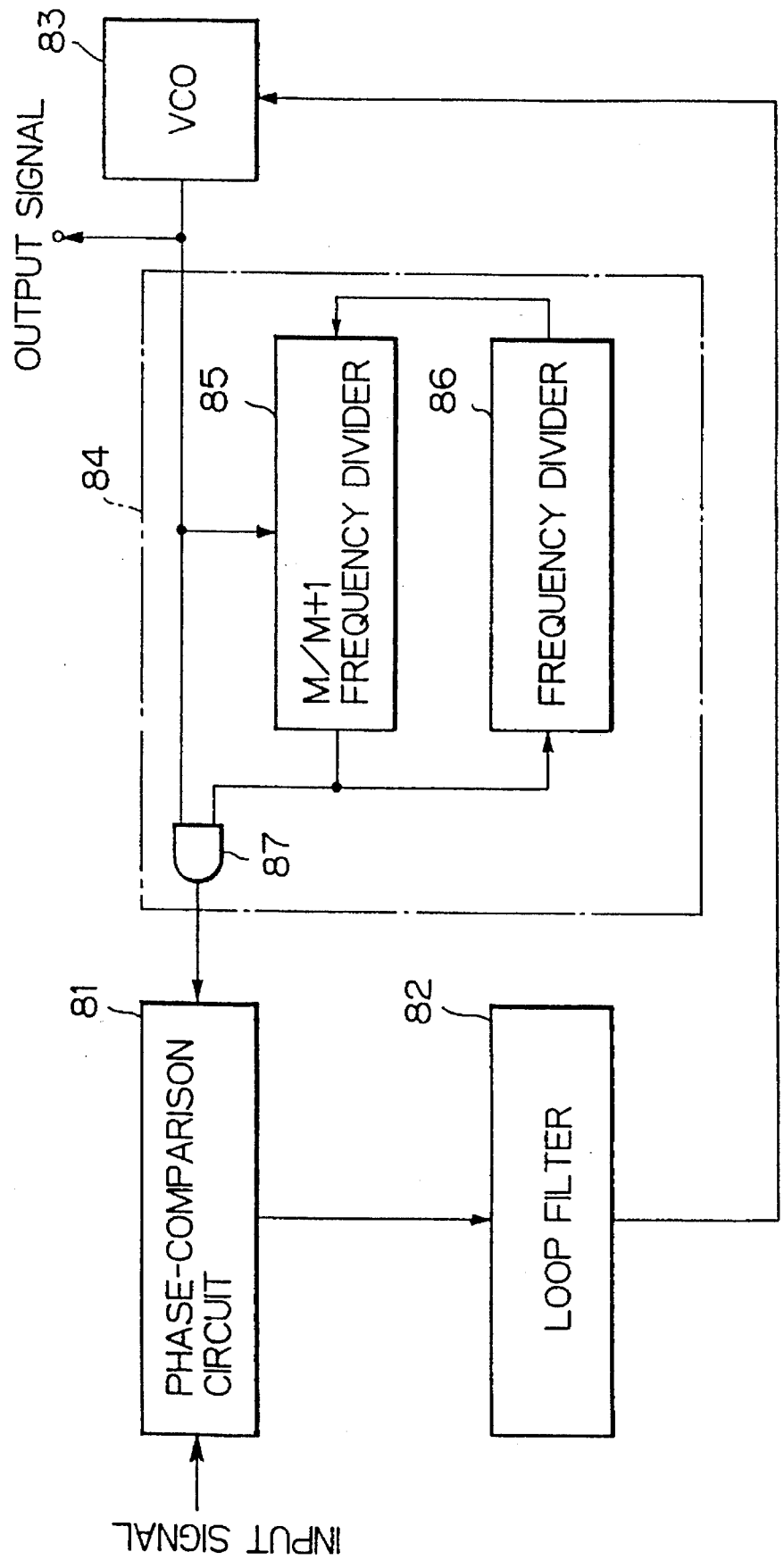
FIG. 8 shows an example of prior art.

FIG. 7 shows the 4th embodiment of the present invention, in which numbers the same as those indicated in FIG. 4 indicate the same parts as in FIG. 4, and in which 50A is the initial-value generating section. When this initial-value generating section 50A has applied to it a holdover signal from a input signal lost detector or other source, the immediately previous initial values are generated, enabling continuous generation of the 1.544-MHz output signal.

By means of the holdover signal, it is possible for this initial-value generating section 50A to use, for example, the number of control operations B in FIG. 5 as the immediately previous number of control operations, with subsequent initial values k[n] repeatedly output as the same values. That is, by making the initial values k[n] the same, it is possible to continue generation of the output signal from output-stage phase-locking circuit 43 even when the input signal is lost.

It is also possible to make a configuration in which this holdover signal is applied to 2nd phase-comparison circuit 54 over the path shown by the dotted line, so that a phase-comparison output signal indicating no phase error is applied to lead data/lag data selection section 51. By doing this, it is possible to take the 2nd programmable-ratio frequency-division circuit 56 switching control signal from average control counter 52 as indicating the immediately previous switching period, so that generation of the 1.544-MHz output signal is continued.

While the above-described 2nd, 3rd, and 4th embodiments are for the case in which the output signal is approximately the same as the input signal, it is possible to use a frequency divider or other means to establish the relationships for frequencies that differ. It is also possible to provide a bandpass filter for the purpose of further suppressing output signal jitter which accompanies the switching between division by 33 and division by 34 in 2nd programmable-ratio frequency-division circuit 56. It is also possible to add a phase-locking circuit (phase-locked loop) for the purpose of suppressing this jitter.

As described above, the present invention has an input-stage phase-locking circuit 2 having a 1st phase-comparison circuit 1 which compares the phase of the 1st frequency-converted output signal to the phase of the input signal, a processing section 3 which determines the frequency component of the input signal based on the phase-comparison output signal from 1st phase-comparison circuit 1, and an output-stage phase-locking circuit 5 having a 2nd phase-comparison circuit 4 which compares the phase of the 2nd frequency-converted output signal with the phase of the input signal, said invention being capable providing an output signal which tracks to the frequency of the input signal by means of input-stage phase-locking circuit 2, and tracks to the phase of the input signal by means of output-stage phase-locking circuit 5. It can therefore be applied to, for example, slave stations in synchronous multiplexed transmission systems, and has in this application the advantage of being able to generate a stable clock signal locked to the clock signal received from a master station. It also has the advantageous of being able to an be implemented totally with digital circuits, thereby facilitating reduction in size.

We claim:

1. A phase-locked oscillator circuit comprising:

an input-stage phase-locking circuit (2) which compares a phase of a 1st frequency-converted output signal derived by frequency division with a phase of an input signal by means of a 1st phase-comparison circuit (1), and which has a feedback loop which controls the phase of said 1st frequency-converted output signal;

a processing section (3) including an average-frequency calculation circuit which determines an average frequency of said input signal, based on a phase-comparison output signal of said 1st phase comparison circuit (1) of said input-stage phase-locking circuit (2); and an output-stage phase-locking circuit (5) which compares a phase of a 2nd frequency-converted output signal derived by frequency division with the phase of said input signal by means of a 2nd phase-comparison circuit (4), and which has a feedback loop which controls the phase of said 2nd frequency-converted output signal based on a phase-comparison output of said 2nd phase-comparison circuit (4) and a processed output signal from said processing section (3).

2. A phase-locked oscillator circuit according to claim 1, wherein a time constant of said input-stage phase-locking circuit (2) is made short and time constant of said output-stage phase-locking circuit (5) is made long.

3. A phase-locked oscillator circuit according to claim 1, wherein said input-stage phase-locking circuit (2) includes said 1st phase-comparison circuit (1), a 1st programmable-ratio frequency-division circuit which generates said 1st frequency-converted output signal, and a 1st lead/lag control section which performs switching control of a frequency division ratio of said 1st programmable-ratio frequency-division circuit, based on a phase-comparison output signal of said 1st phase-comparison circuit (1).

4. A phase-locked oscillator circuit according to claim 1, wherein said output-stage phase-locking circuit (5) includes said 2nd phase-comparison circuit (4), said 2nd programmable-ratio frequency-division circuit which generates said 2nd frequency-converted output signal, and a 2nd lead/lag control section which performs switching control of a division ratio of said 2nd programmable-ratio frequency division circuit based on a phase-comparison output signal of said 2nd phase-comparison circuit 141 and on a processed output signal of said processing section (3).

5. A phase-locked oscillator circuit according to claim 3, wherein said 1st phase-comparison circuit (1) of said input-stage phase-locking circuit (2) is configured to detect whether the phase of said 1st frequency-converted output signal leads or lags with respect to said input signal.

6. A phase-locked oscillator circuit according to claim 1, wherein said processing section (3) includes a counter which counts either a lead or lag phase-comparison output signal from said 1st phase-comparison circuit (1) of said input-stage phase-locking circuit (2), and an average-value calculating section which determines a time average of the count of said counter.

7. A phase-locked oscillator circuit according to claim 4, wherein said 2nd phase-comparison circuit (4) of said output-stage phase-locking circuit (5) detects whether the phase of said 2nd frequency-converted output signal leads or lags with respect to said input signal.

8. A phase-locked oscillator circuit according to claim 1, wherein said 1st frequency-converted output signal of said input-stage phase-locking circuit (2) and said 2nd frequency-converted output signal of said output-stage phase-locking circuit (5) are produced by 1st and 2nd programmable-ratio frequency-division circuits, respectively, which divide a frequency of an output signal from a fixed-frequency oscillator.

9. A phase-locked oscillator circuit according to claim 1, wherein said processed output signal which is applied to said output-stage phase-locking circuit (5) from said processing section (3), is fixed by a holdover signal.

* * * * *